United States Patent
Peidous et al.

(12) 
(10) Patent No.: US 6,380,610 B1
(45) Date of Patent: *Apr. 30, 2002

(54) DISLOCATION FREE LOCAL OXIDATION OF SILICON WITH SUPPRESSION OF NARROW SPACE FIELD OXIDE THINNING EFFECT

(75) Inventors: Igor V. Peidous; Elgin Quek; Konstantin V. Loiko, all of Singapore; David Yeo Yong Hock, S'pore, all of (SG)

(73) Assignee: Chartered Semiconductor Manufacturing Ltd., Singapore (SG)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/257,838

(22) Filed: Feb. 25, 1999

Related U.S. Application Data

(62) Division of application No. 08/866,776, filed on May 30, 1997, now Pat. No. 5,894,059.

(51) Int. Cl.$^7$ .............................................. H01L 23/58
(52) U.S. Cl. ...................... 257/638; 257/637; 438/448; 438/761; 438/950
(58) Field of Search ................................ 438/439, 444, 438/446, 448, 761, 778, 950; 257/509, 632, 635, 637, 638, 647

(56) References Cited

U.S. PATENT DOCUMENTS

| | | | |
|---|---|---|---|
| 5,132,241 A | 7/1992 | Su | 438/228 |
| 5,294,563 A | 3/1994 | Rao | 438/448 |
| 5,374,586 A * | 12/1994 | Huang et al. | 438/439 |
| 5,397,733 A | 3/1995 | Jang | 438/439 |
| 5,445,990 A | 8/1995 | Vook et al. | 438/443 |
| 5,633,191 A * | 5/1997 | Chao | 438/448 |

OTHER PUBLICATIONS

S. Wolf, "Silicon Processing For The VLSI Era" vol. 2, Lattice Press, Sunset Beach, CA, 1990, p639.
P. Bellotti et al. "Oxide Growth Effects in Micron and Submicron Field Regions" J. Electrochem.Soc. 143 (1996), p2953–7.

* cited by examiner

*Primary Examiner*—Olik Chaudhuri
*Assistant Examiner*—Anh Duy Mai
(74) *Attorney, Agent, or Firm*—George O. Saile; Rosemary L. S. Pike

(57) ABSTRACT

A novel design of an oxidation mask for improved control of birds beak and more specifically for tailoring and smoothing the field oxide isolation profile in the vicinity of the birds beak. The mask design is particularly advantageous for narrow field isolation spacings found in sub half-micron integrated circuit technology. The mask uses a thin silicon nitride foot along its lower edge to allow nominal expansion of the oxide during the early stages of oxidation, thereby permitting in-situ stress relief as well as a smoothing of the oxide profile. A cantilevered portion of a second, thicker silicon nitride layer suppresses the upward movement of the flexible foot during the later stages of the oxidation when the growth rate has slowed, thereby inhibiting the growth of the birds beak. Shear stresses responsible for dislocation generation are reduced as much as fifty fold. This stress reduction is accompanied by an improvement in surface topography as well as suppression of the narrow oxide thinning effect.

2 Claims, 4 Drawing Sheets

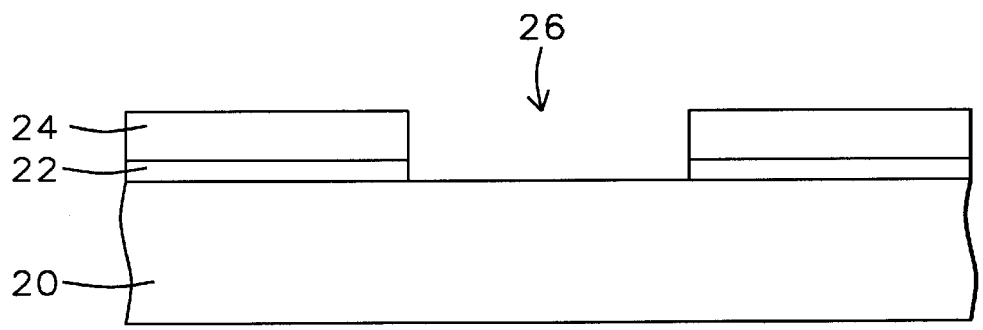
FIG. 1 - Prior Art
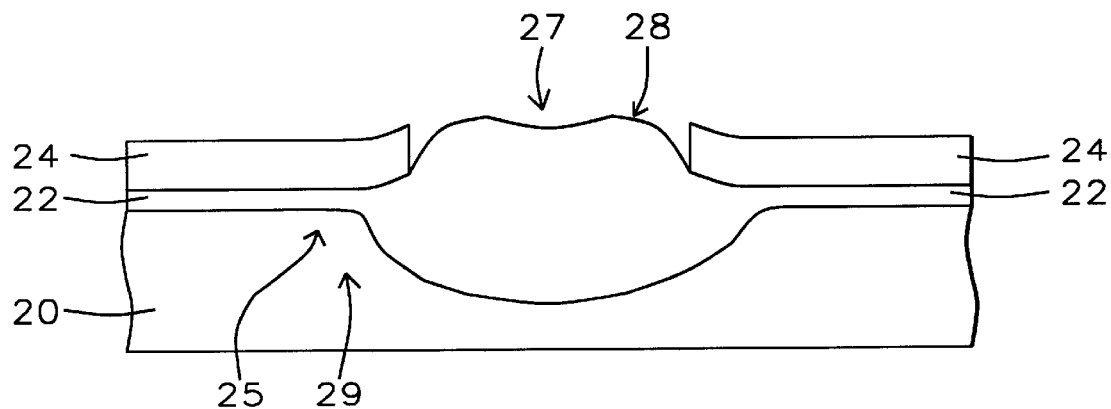
FIG. 2 - Prior Art
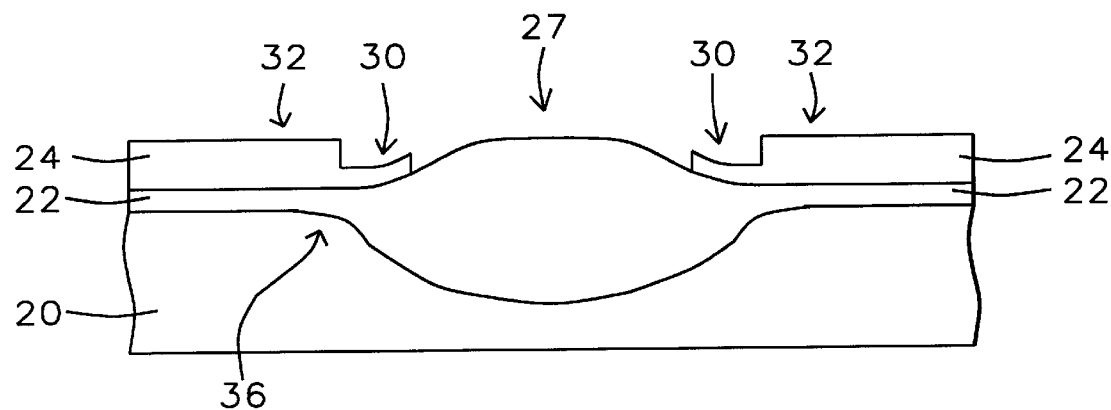
FIG. 3 - Prior Art

DISLOCATION FREE LOCAL OXIDATION OF SILICON WITH SUPPRESSION OF NARROW SPACE FIELD OXIDE THINNING EFFECT

This is a division of patent application Ser. No. 08/866,776 now U.S. Pat. No. 5,894,059, filing date May 30, 1997, Dislocation Free Local Oxidation Of Silicon With Suppression Of Narrow Space Field Oxide Thinning Effect, assigned to the same assignee as the present invention.

BACKGROUND OF THE INVENTION

1. Field of the Invention

The invention relates to processes for the manufacture of semiconductor devices and more particularly to processes for forming field isolation.

2. Description of Prior Art

The formation of integrated circuit devices on silicon substrates requires that a means be provided to electrically isolate the various circuit components from each other. In many cases p/n junctions themselves can be used to form at least part of the necessary isolation. Most isolation requirements, which cannot be resolved by circuit design, relate to the lateral isolation of devices. To some extent, junction isolation can be used here also. However, as device technology leads to smaller and smaller geometries as well as shallower structures, junction isolation technology becomes very limited.

The successful use of silicon for integrated circuits for the last thirty years can, in part, be attributed to the marvelous insulating properties of it's oxide. No other commonly known semiconductor material has this unique feature. Thus silicon oxide has become well established as the isolation material for integrated circuit chips. Earliest usage of this material involved growing it on the substrate in selected regions which are defined by an oxidation masking material. To this end, silicon nitride came into widespread use. Referring to FIG. 1, a pad silicon oxide film 22 several hundred Angstroms thick is grown on the surface of a silicon wafer 20. Next a film of silicon nitride 24 is deposited to a thickness of several thousand Angstroms using a chemical-vapor-deposition process. The pad oxide 22 is used as a buffer layer, preventing the highly stressed silicon nitride from causing dislocations in the silicon.

Using standard photolithographic techniques followed by etching, a pattern is defined in the oxide/nitride mask, leaving bare those regions 26 on the silicon which are to become isolation regions. Referring next to FIG. 2, the wafer 20 is subjected to an oxidizing ambient at elevated temperatures, during which the exposed areas are converted to silicon oxide 28. The oxidation proceeds at the oxide-silicon interface. Thereby pockets of silicon oxide 27 several thousand Angstroms deep can be formed in the patterned areas. These pockets 27 provide the necessary electrical isolation for the subsequently formed semiconductor devices. The process just described has become known by several names, one of which is LOCOS an acronym for LOCal Oxidation of silicon. LOCOS has been practiced for over twenty-five years and has been adapted to many specific applications. One of the problems with conventional LOCOS, illustrated in FIG. 2 is that the pad oxide 22 permits oxidation to take place under the silicon nitride mask, pushing up the edge of the mask and thereby leaving a raised portion of the oxide around the mask perimeter, known as "Birds Head" 28 and a protrusion of oxide under the edge of the oxidation mask 29, caused by diffusion of oxidant through the thin pad oxide 22, known as "Birds Beak". The birds head 28, being a protrusion above the surface, causes shadowing and thinning problems with subsequently deposited metallization stripes traversing across it. Thin areas in metal interconnection lines constitute "weak spots" and are subject to increased current density, heating, and subsequent electrical failure. The birds beak 29 can be reduced by using as thin as possible pad oxide 22 or by stiffening the mask by using a thicker silicon nitride layer 24. In some instances, a sidewall oxidation barrier is formed along the mask edge to prevent penetration of the oxidant under the nitride mask. Unfortunately, these practices lead to an abrupt feature 25 wherein the high shearing stresses are produced in the silicon which lead to the formation of dislocations. These dislocations propagate diagonally into the device active regions causing junction failure.

Typically, the field oxide is grown at temperatures above 1,000° C. At these temperatures, stresses which would be developed due to the volume expansion, are relieved by plastic flow of the oxide. However, upon completion of the oxidation, and when the wafer is cooled, sufficient plastic flow is no longer able to relieve stresses below about 960° C. (Wolf, S.,"Silicon Processing for the VLSI Era", Vol.2, Lattice Press, Sunset Beach, Calif., (1990),p693). Thermal stresses now develop due to the difference in thermal expansion coefficients of the silicon oxide and the silicon. The profile of the field oxide is now the determining factor for the distribution of stresses within the silicon. Abrupt features in the silicon/silicon oxide profile, such as 25 in FIG. 2, are responsible for high values of x-y shearing stresses which produce dislocations. Such abrupt features 25 occur when a stiff mask edge is used to control the field oxidation.

The compressive stresses developed within the growing field oxide also have been observed to retard the oxidation rate of silicon. Known as the field oxide thinning effect, this phenomena is observed when field oxide is grown in mask openings below about 0.5 to 0.6 microns. See for example, P. Belluti and M. Zen in J. Electrochem. Soc. 143, (1996) p 2953.

Efforts to diffuse the abruptness of a stiff mask edge and to control the extent of birds beak encroachment into the silicon active area as well as the shape of the birds head, have been made using "L" shaped spacers which form a foot at the mask edge. Jang U.S. Pat. No. 5,397,733 describes several ways in which these spacers can be formed. An example of such a spacer is shown in FIG. 3. The thin nitride foot 30 surrounding the periphery of the thicker nitride mask provides a region of more flexible mask at the edge of the opening, thereby allowing easier expansion of the growing field oxide under it. The thicker, and therefore stiffer, section 32 continues to constrict the birds beak. By proper selection of the thickness and length of the mask foot 30 as well as the thickness of the more rigid portion 32, it becomes possible to tailor the mask edge to provide a field oxide profile 36 with reduced stress at the expense of minimal birds beak encroachment. Jang cites prior art difficulties in forming the L-shaped spacer, specifically, difficulties in controlling thickness and length of the spacer. Indeed, the control of these parameters in a manufacturing environment is difficult.

The precise tailoring of the field oxidation mask edge becomes even more critical as device geometries shrink into the sub-half micron range. As field oxide widths approach these dimensions oxidation rates are significantly reduced and stress induced crystalline defects cause serious degradation of the semiconductor devices. The balance between reducing birds beak encroachment and preventing stress induced dislocations requires an even greater control of the field oxide oxidation mask edge. The invention herein described provides an added dimension in mask engineering. In addition, the invention eliminates the process steps required by Jang et.al. for spacer formation.

Yook et.al. U.S. Pat. No. 6,445,990 teaches the use of a mask comprising two silicon nitride layers separated by a silicon oxide layer. Each silicon nitride layer is patterned with an opening after it is formed, thereby necessitating two photolithographic steps. The opening in the second nitride layer is smaller than that in the first nitride layer and is concentric with it. After the field oxide is grown a third photolithographic step protects the field isolation region while the oxidation mask and the birds beak region are removed. This method effectively uses the stiff mask approach to reduce birds beak and makes no effort to subdue abrupt oxide contours or reduce stress formation.

Rao U.S. Pat. No. 5,294,563 similarly uses an edge sealed poly buffered nitride mask wherein nitride sidewalls on the polybuffered mask edge provide an edge seal to all but the thinner than conventional pad oxide. The result is similar to other stiff-mask/thin-pad oxide methods of reducing birds beak.

Su et.al. U.S. Pat. No. 5,294,563 teaches the use of an undercut of the polysilicon of a conventional poly buffered silicon nitride oxidation mask to create an overlap by the subsequently formed oxide isolation of an implanted well. This permits the same mask to be used for both the implant and the isolation oxidation.

SUMMARY OF THE INVENTION

It is an object of this invention to provide a method for forming a field oxide isolation compatible with sub-half-micron device technology having reduced stress induced dislocations.

It is another object of this invention to provide a method for forming a field oxide isolation having a smooth surface topology at its periphery, thereby improving step coverage of subsequently deposited conductive layers.

It is yet another object of this invention to provide a method for forming a field oxide isolation with improved minimal birds beak encroachment into device active areas.

It is still another object of this invention to suppress the field oxide thinning effect which occurs when field oxide is grown between narrow mask spacings.

It is yet another object of this invention to describe a novel oxidation mask which will yield an improved field oxide isolation for use with sub half-micron integrated circuit technology.

These objects are accomplished by the use of a novel oxidation mask for growing the field oxide isolation. The mask is so designed that the stiffness of its edge changes during the oxidation cycle. During the initial stages of oxidation, when the oxidation rate is greatest, the mask edge is flexible and permits the rapidly growing silicon oxide to expand somewhat freely at the mask edge. thereby permitting relief of growth induced stresses. The dynamic relief of compressive stresses during the early stages of oxide growth, by use of a flexible mask edge, has the added benefit of suppressing the field oxide thinning effect.

As oxidation proceeds the mask edge becomes stiffer, thereby restricting subjacent growth and reducing birds beak encroachment. The edge of the mask is so designed that the edge stiffness begins to increase when the growth rate has slowed sufficiently to enable stress relief by viscous flow of the growing oxide. This feature thus provides a time dependent means for controlling birds beak and stress by mask design.

The mask comprises two layers of silicon nitride separated by an auxiliary layer and deposited over a pad oxide layer. The auxiliary layer between the two silicon nitride layers is recessed by a controlled amount. The first silicon nitride layer, being thinner than the second then becomes a flexible foot at the mask edge which permits a smoother lateral transition. After the initial growth period the first silicon nitride mask contacts the thicker cantilevered second silicon nitride which causes the stiffness of the mask edge to increase.

BRIEF DESCRIPTION OF THE DRAWINGS

FIG. 1 is a cross sectional view of a wafer with a conventional LOCOS oxidation mask before field oxide formation.

FIG. 2 is a cross sectional view of a wafer with a conventional LOCOS oxidation mask after field oxide formation.

FIG. 3 is a cross sectional view of a wafer having a LOCOS oxidation mask with a modified edge according to prior art.

DESCRIPTION OF THE PREFERRED EMBODIMENTS

Figure 4A:
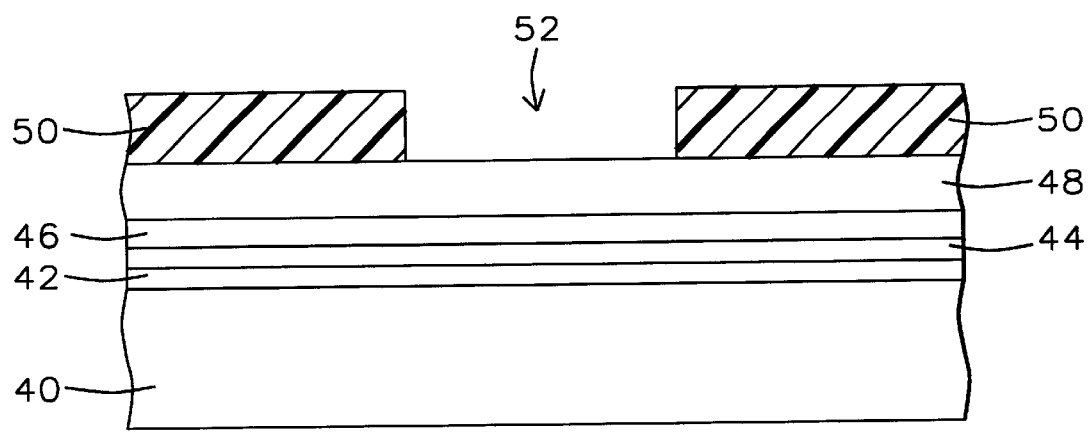
FIGS. 4A through FIG. 4D are cross sectional views of a wafer showing the sequence of processing steps for forming the LOCOS oxidation mask according to this invention.

Referring now to FIG. 4A, a p-doped <100> oriented monocrystalline silicon wafer 40 having a resistivity of between about 6 to 9 ohm cm. Is used. A multi-layered oxidation mask is formed by first growing a layer of silicon oxide(pad oxide) 42 to a thickness of about 20 nm. by subjecting the wafer to a clean dry oxidizing ambient in a furnace at about 950° C. A first silicon nitride layer 44 between about 30 and 100 nm. thick is then deposited, preferably by low pressure chemical vapor deposition (LPCVD). An auxiliary layer 46 of silicon oxide is deposited over the first silicon nitride 44 layer by LPCVD at a temperature of about 800° C. The thickness of the layer 46 is between about 10 and 100 nm. Next a second silicon nitride layer 48 is deposited over the auxiliary layer using LPCVD at about 800° C. to a thickness of about 150 nm. This completes the deposition of the isolation mask stack.

Figure 4B:
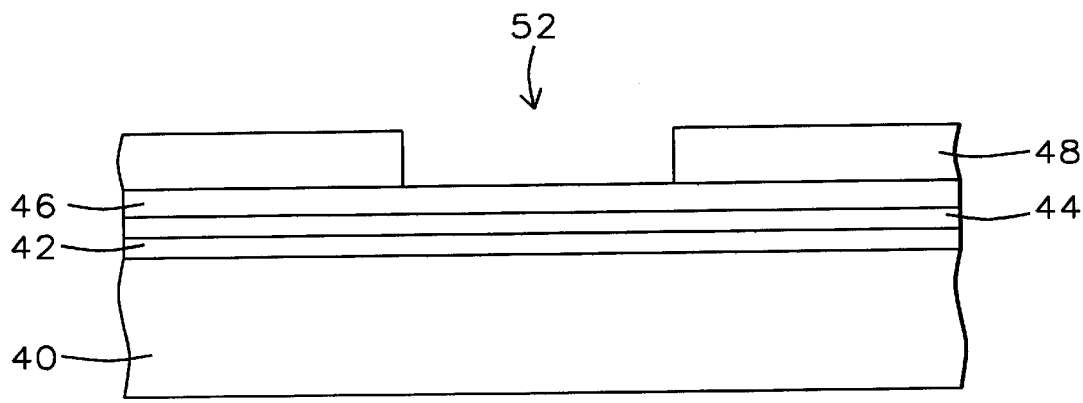

Photoresist 50 is applied over the mask stack, and patterned by well known photolithographic techniques to define an area 52 where a field isolation region is to be formed. Exposure at the mask formation is chosen to secure the dimensions of spaces during development 50 nm. less than they are on the reticle. The second silicon nitride layer 48 is then etched using RIE whereby the opening 52 in the photoresist is translated into an opening 52 between about 350 and 600 nm wide in the second silicon nitride layer 48. The residual photoresist is then stripped, either by plasma ashing or by chemical strippers. FIG. 4B shows the cross section after the photoresist has been removed.

Figure 4C:
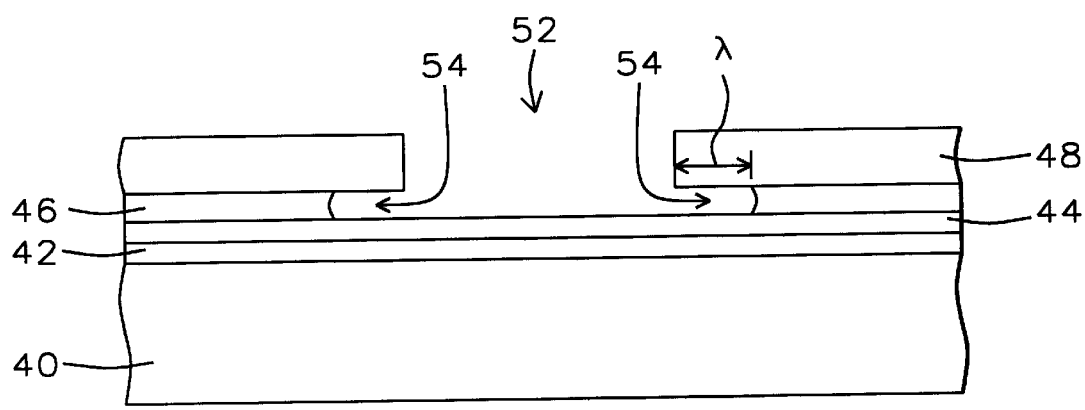

Referring now to FIG. 4C, a wet chemical etch is applied to remove the auxiliary silicon oxide layer 46 in the opening 52 as well as provide the undercut 54 between the two silicon nitride layers. For the silicon oxide auxiliary layer an etchant comprising 50 parts by volume of deionized water (DI-H$_2$O) and 1 part by volume of 49 wt % (28.3 molar) HF. The etch rate of this preparation is calibrated so that the etch time to achieve the desired undercut distance λ may be determined. An etch time of 15 minutes produces a cavity length λ of about 75 nm. The lateral cavity is etched to a depth of between about 300 and 500 nm.

Figure 4D:
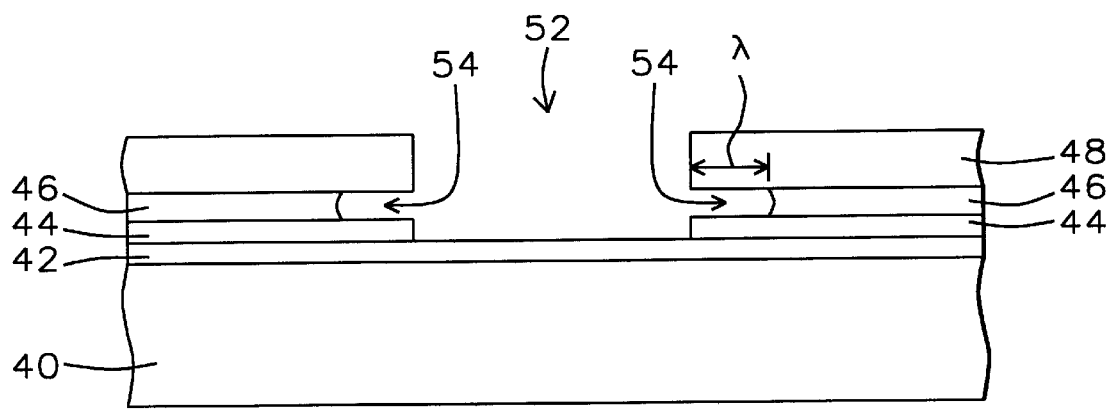

The field isolation mask is then completed as shown in FIG. 4D, by etching the first silicon nitride layer 44 by RIE using the opening 52 in the second silicon nitride layer 48 as a mask. The pad oxide 42 acts as an etch stop for this etch. Endpoint is determined by optical spectroscopy by observing the appearance of oxygen in the etching ambient. Appropriate etchants and conditions to provide high etch-rate-ratios are well known to those practicing this art such that the taper of the walls of the resultant opening can be well controlled, and the etching can be cleanly terminated at or slightly within the pad oxide layer 42.

Figure 5A:
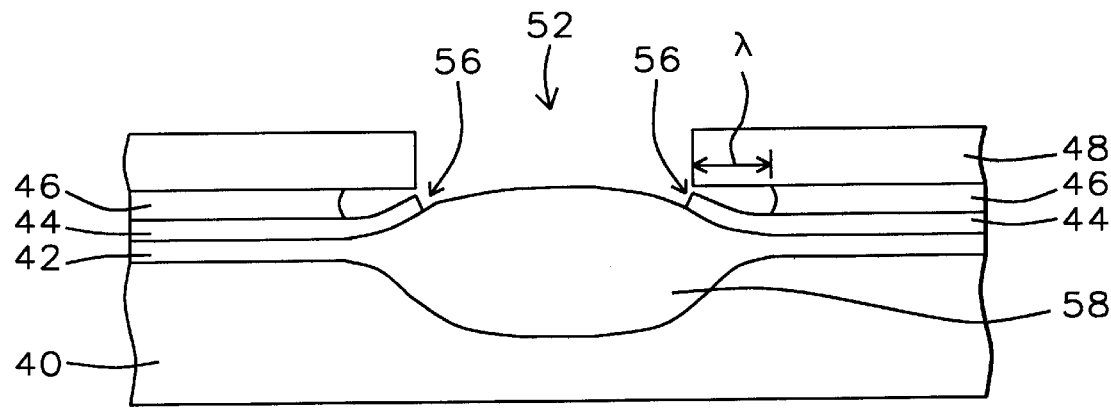
FIGS. 5A and FIG. 5B are cross sectional views of a wafer showing a field oxide at two instants of time during its growth using an oxidation mask formed according to this invention.

The field oxide isolation is next grown in a clean oxidation furnace using an ambient gas containing oxygen, either alone or in combination with water vapor, and an optional chlorine containing additive such as trichloroethane to minimized mobile ion contamination. The oxidation temperature is typically between 950° C. and 1,100° C. FIG. 5A shows a cross section of the field oxide 58 at an early stage of growth. The edges of the first silicon nitride layer 44 of the oxidation mask have been pushed up by the growth of oxide under the pad oxide. The growth rate of the field oxide is governed by linear-parabolic kinetics wherein the growth rate is very rapid initially and then slows parabolically according to the diffusion of the oxidizing species. The thin silicon nitride foot 56 flexes and permits the rapidly growing silicon oxide expand, thereby providing a means of stress relief which supplements stress relief by plastic flow. Additionally the silicon nitride foot also permits a smooth silicon/silicon oxide profile under the mask edge.

Figure 5B:
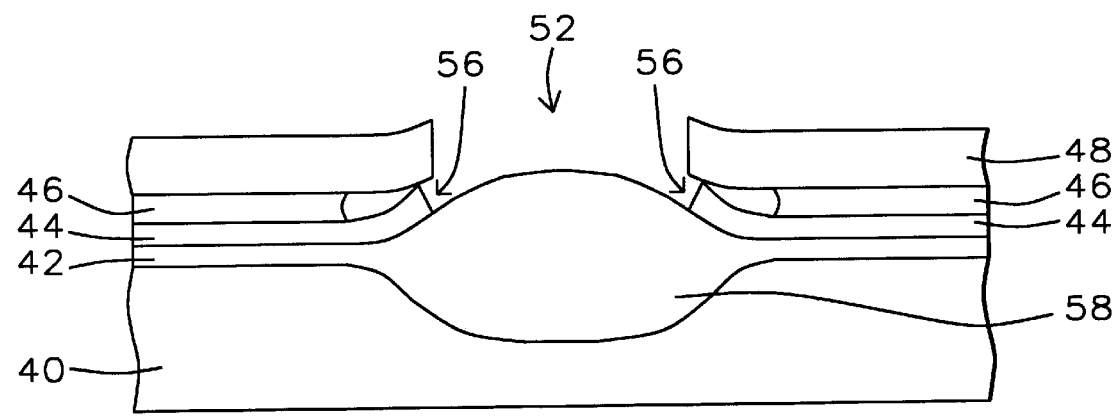

Referring now to FIG. 5B. the field oxide 58 is shown at a later stage of growth wherein the outward portion of the silicon nitride foot 56 has now butted against the lower edge of the thicker silicon nitride layer 48. This stiffer layer 48 restrains the flexing of the silicon nitride foot 56 and consequently suppresses the formation of birds beak. At this point in time the growth rate of the field oxide 58 has slowed substantially, and plastic flow permits timely relief of growth stresses.

The benefits of an approximately 50 fold reduction in the shear stress component as well as the improved smoothness of edge coverage are realized by this method at the expense of a somewhat longer than conventional birds beak. This birds beak encroachment can be compensated by a lithography bias in the photomask processing. It can also be conveniently removed by a dip etch in dilute HF after the photomask is removed.

Figure 6:
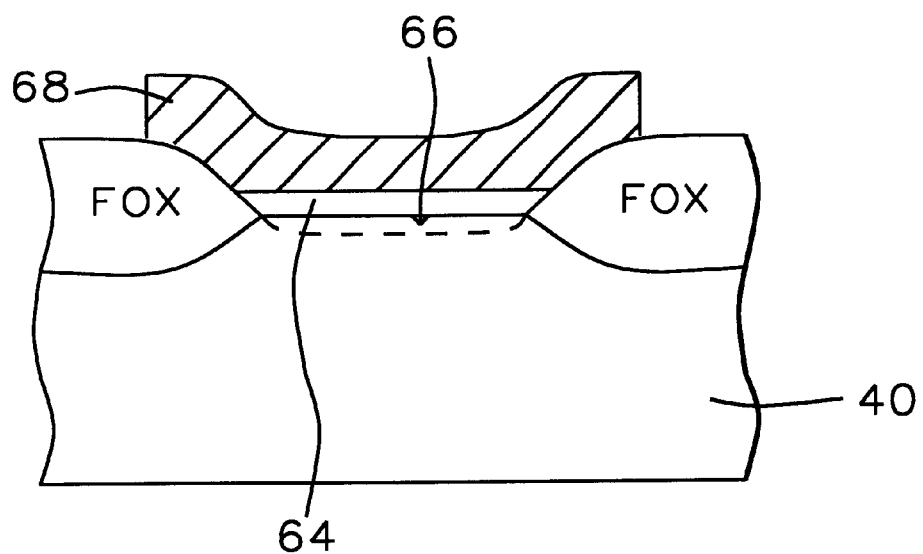
FIG. 6 is a cross sectional view of a MOS field effect transistor showing a channel between two field oxide isolation regions.

Narrow channel MOS field effect transistor devices are then fabricated in and over the silicon regions adjacent to the field oxide isolation patterns. A cross section of the channel of such a device is shown in FIG.6 wherein the self-aligned channel 66 is formed between two field oxide isolation regions(FOX). A thin silicon oxide layer 64 overlies the channel 66 and a conductive gate electrode 68 is positioned over the surface of the field isolation(FOX), and the silicon oxide layer 64. The source/drain regions (not shown) are located adjacent to the gate region into and out of the plane of the page.

While the invention has been particularly shown and described with reference to the preferred embodiments thereof it will be understood by those skilled in the art that various changes in form and details may be made without departing from the spirit and scope of the invention.

What is claimed is:

1. An oxidation mask for the local oxidation of silicon comprising:
    (a) a pad oxide;
    (b) a first silicon nitride layer over said pad oxide;
    (c) an auxiliary layer over said first silicon nitride layer;
    (d) a second silicon nitride layer over said auxiliary layer;
    (e) an opening passing through said second silicon nitride layer, said auxiliary layer, and said first silicon nitride layer, whereby the said opening in said second silicon nitride layer is of the same width as and concentric with said opening in said first silicon nitride layer; and
    (f) a lateral cavity in within said opening, recessing said auxiliary layer under the perimeter of said second silicon nitride layer whereby said second silicon nitride layer is undercut and overhangs said first silicon nitride layer in said opening.

2. The oxidation mask of claim 1 wherein said auxiliary layer is selected from the group consisting of silicon oxide and polysilicon.

* * * * *

UNITED STATES PATENT AND TRADEMARK OFFICE
CERTIFICATE OF CORRECTION

PATENT NO. : 6,380,610 B1
DATED : April 30, 2002
INVENTOR(S) : Igor V. Peidous, Elgin Quek, Konstantin V. Loiko and David Yeo Yong Hock It is certified that error appears in the above-identified patent and that said Letters Patent is hereby corrected as shown below:

<u>Title page,</u>
Item [75], Inventors, delete "S'pore", and replace with -- Singapore --.

Signed and Sealed this

Nineteenth Day of November, 2002

Attest:

Attesting Officer

JAMES E. ROGAN
Director of the United States Patent and Trademark Office